US012615867B2

(12) United States Patent
Kataoka

(10) Patent No.: US 12,615,867 B2
(45) Date of Patent: Apr. 28, 2026

(54) DETECTION DEVICE

(71) Applicant: Magnolia White Corporation, Tokyo (JP)

(72) Inventor: Shingo Kataoka, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 298 days.

(21) Appl. No.: 18/365,486

(22) Filed: Aug. 4, 2023

(65) Prior Publication Data

US 2023/0387156 A1 Nov. 30, 2023

Related U.S. Application Data

(63) Continuation of application No. PCT/JP2022/003179, filed on Jan. 27, 2022.

(30) Foreign Application Priority Data

Feb. 4, 2021 (JP) ................................. 2021-016795

(51) Int. Cl.
*H10F 39/00* (2025.01)
*G02B 5/20* (2006.01)
*G02B 5/28* (2006.01)
*H10F 39/18* (2025.01)

(52) U.S. Cl.
CPC ......... *H10F 39/8053* (2025.01); *G02B 5/208* (2013.01); *G02B 5/28* (2013.01); *H10F 39/182* (2025.01)

(58) Field of Classification Search
None
See application file for complete search history.

(56) References Cited

U.S. PATENT DOCUMENTS

2011/0043735 A1 2/2011 Kozuma et al.
2015/0301402 A1 10/2015 Kimura et al.

FOREIGN PATENT DOCUMENTS

JP 2011071495 A 4/2011
JP 2016-072899 A 5/2016
WO 2014/103418 A1 7/2014
WO 2019/022069 A1 1/2019

OTHER PUBLICATIONS

English machine translation of Office Action dated Dec. 10, 2024, issued in JP Appl. No. 2022-579501, 3 pages.
Office Action issued on Sep. 10, 2024, in corresponding Japanese Application No. 2022-579501, 6 pages.
International Search Report issued on Apr. 12, 2022 in corresponding application No. PCT/JP2022/003179; 6 pages.

*Primary Examiner* — Mark R Milia
(74) *Attorney, Agent, or Firm* — Maier & Maier, PLLC

(57) ABSTRACT

A detection device includes a photodetector, a filter layer overlapped on the photodetector and including a first color material having a peak transmittance for light in a first wavelength band, and a display panel arranged over the filter layer, wherein the filter layer has a peak transmittance of 90% or more, a transmittance of 80% or more at a wavelength of 550 nm, a transmittance of 10% is more at a wavelength of 600 nm, and a transmittance of 10% or less at a wavelength of 680 nm to 700 nm.

7 Claims, 10 Drawing Sheets

<u>100</u>

100B

DETECTION DEVICE

CROSS-REFERENCE TO RELATED APPLICATIONS

This application is a Continuation of International Patent Application No. PCT/JP2022/003179, filed on Jan. 27, 2022, which claims the benefit of priority to Japanese Patent Application No. 2021-016795, filed on Feb. 4, 2021, the entire contents of which are incorporated herein by reference.

FIELD

An embodiment of the invention relates to a detection device that performs personal authentication by an optical method using fingerprints.

BACKGROUND

In recent years, detection devices have been installed in smartphones and other electronic devices. In the detection devices, a filter layer is necessary to cut light that would otherwise penetrate the finger and reach the sensor to improve authentication accuracy under natural light. Conventionally, an external IR cut filter has been used as a filter layer.

On the other hand, to achieve thinness in the detection device, it is required to form the IR cut filter integrally instead of using the external IR cut filter. Patent Literature 1 discloses an IR cut filter used in a solid-state imaging device (WO 2019/022069).

In order to achieve both a thin film and low cost in the detection devices, it is required to divert a deposition process of color filters arranged in conventionally used LCD panels instead of a deposition process of inorganic films to achieve the same characteristics as those of inorganic films. Patent Literature 2 discloses a solid-state imaging device using a color filter as a filter layer (Japanese Laid-Open Patent Publication No. 2016-728899).

SUMMARY

A detection device according to an embodiment of the present invention includes a photodetector, a filter layer overlapping the photodetector and including a first color material having a peak transmittance for light in a first wavelength band, and a display panel arranged over the filter layer, wherein the filter layer has a peak transmittance of 90% or more, a transmittance of 80% or more at a wavelength of 550 nm, a transmittance of 10% or more at a wavelength of 600 nm, and a transmittance of 10% or less at a wavelength of 680 nm to 700 nm.

DESCRIPTION OF EMBODIMENTS

Embodiments of the present invention will be described below with reference to the drawings and the like. However, the present invention can be implemented in various modes without departing from the gist thereof and should not be construed as being limited to the description of the following embodiments. With reference to the drawings, although the width, thickness, shape, and the like of each part may be schematically represented as compared with actual embodiments to make the description clearer, the schematic drawings are only examples and do not limit the interpretation of the present invention. In addition, in the present specification and each of the drawings, the same or similar elements as those described with reference to the preceding drawings are denoted by the same symbols, and a repetitive description thereof may be omitted.

In the present invention, when one film is processed to form multiple films, these multiple films may have different functions and roles. However, these multiple films are derived from films formed as the same layer by the same process and have the same layer structure and material. Therefore, these multiple films are defined as existing in the same layer.

In this specification, expressions such as "above", "below" and the like when describing the drawings represent relative positional relationships between a structure of interest and other structures. In this specification, in a side view, a direction from an insulating surface to a light-emitting element, which will be described later, is defined as "above", and the opposite direction is defined as "below". In this specification and claims, when expressing the mode of arranging another structure on a certain structure, both the case of arranging another structure directly above a certain structure and the case of arranging another structure above a certain structure via another structure are included, unless otherwise specified.

First Embodiment

A detection device 100 according to an embodiment of the present invention will be described with reference to FIG. 1 to FIG. 10.

Figure 1:
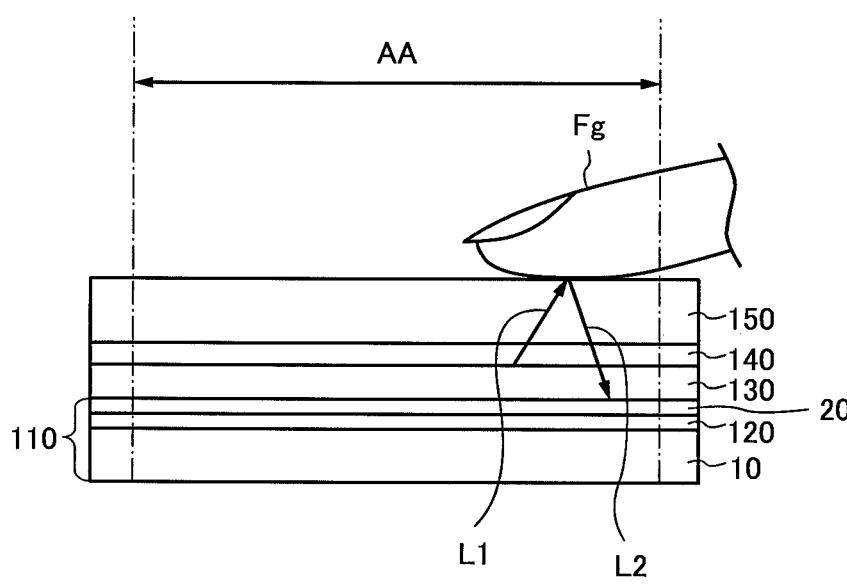
FIG. 1 is a cross-sectional view of a detection device according to an embodiment of the present application.

FIG. 1 is a cross-sectional view of the detection device 100 according to an embodiment of the invention. As shown in FIG. 1, the detection device 100 has a sensor substrate 110, a filter layer 120, a display panel 130, an adhesive layer 140, and a cover member 150. In other words, in a direction perpendicular to a surface of the sensor substrate 110, the sensor substrate 110, the filter layer 120, the display panel 130, the adhesive layer 140, and the cover member 150 are stacked in this order. A detection area of the detection device 100 is shown as a detection area AA.

An array substrate 10 of the sensor substrate 110 includes a plurality of pixels 30 (illustrated in FIG. 2) arranged in a two-dimensional array. Each of the plurality of pixels 30 includes a photodetector. For example, the photodetector is a PIN (Positive Intrinsic Negative Diode) type photodiode or a photodiode made of an organic semiconductor.

The filter layer 120 is arranged on the array substrate 10 of the sensor substrate 110. The filter layer 120 is overlaps an entire two-dimensional array of the array substrate 10. The filter layer 120 has a function of transmitting light in a predetermined wavelength band. The filter layer 120 will be described in detail later.

The display panel 130 is arranged on the filter layer 120. For example, the display panel 130 may be an organic light-emitting diode display (OLED: Organic Light Emitting Diode) or an inorganic EL display (for example, micro-LED and mini-LED). Alternatively, the display panel 130 may be a liquid crystal display panel (LCD: Liquid Crystal Display) using a liquid crystal element as a display element or an electrophoretic display panel (EPD: Electrophoretic Display) using an electrophoretic element as a display element.

The adhesive layer 140 is arranged between the display panel 130 and the cover member 150. The adhesive layer 140 can be used to bond the display panel 130 and the cover member 150. The detection device 100 may have a structure in which the adhesive layer 140 is not arranged in the area corresponding to the detection area AA of the sensor substrate 110. When the adhesive layer 140 is not arranged in the detection area AA, the detection device 100 has a structure in which the adhesive layer 140 adheres to the cover member 150 and the display panel 130 in an area corresponding to a peripheral area outside the detection area AA. The adhesive layer 140 in the detection area AA protects the display panel 130.

The cover member 150 is translucent and is a protective member that protects the display panel 130. For example, a glass substrate or a resin substrate is used for the cover member 150. The cover member 150 may not be arranged on the display panel 130. In this case, a finger Fg contacts the display panel 130.

In the detection device 100, the display light (light L1) emitted from the display panel 130 is reflected as light L2 by the finger Fg, the detection target. The detection device 100 detects the surface irregularity (e.g., fingerprints) of the finger Fg by detecting the light L2 reflected by the finger Fg. Further, in addition to detecting fingerprints, the detection device 100 may detect information about a living body by detecting the light L2 reflected inside the finger Fg. For example, the information about the living body is an image of blood vessels such as veins, pulse rate, pulse wave, and the like. The color of the light L1 irradiated from the display panel 130 may differ according to the detection target. Thus, based on the light L1 irradiated from the display panel 130 and the light L2 reflected by the finger Fg, the fingerprint of the finger Fg and information about the living body can be detected.

A color filter arranged in a conventionally used liquid crystal panel can be used as a filter layer used in a fingerprint detection device. However, even if a color filter is used as an IR cut filter in a detection device, sensor characteristics equivalent to those of an external IR cut filter could not be obtained. Therefore, the detection device could not detect fingerprints under natural light.

In addition, there is no clear indicator of the required characteristics when using a color filter arranged in a conventionally used LCD panel as an IR cut filter.

Therefore, one of the purposes of an embodiment of the present invention is to provide a thinner detection device 100. Alternatively, one of the purposes of the present invention is to provide a method for calculating the required characteristics as quantitative values when a color filter is used as an IR cut filter.

Figure 2:
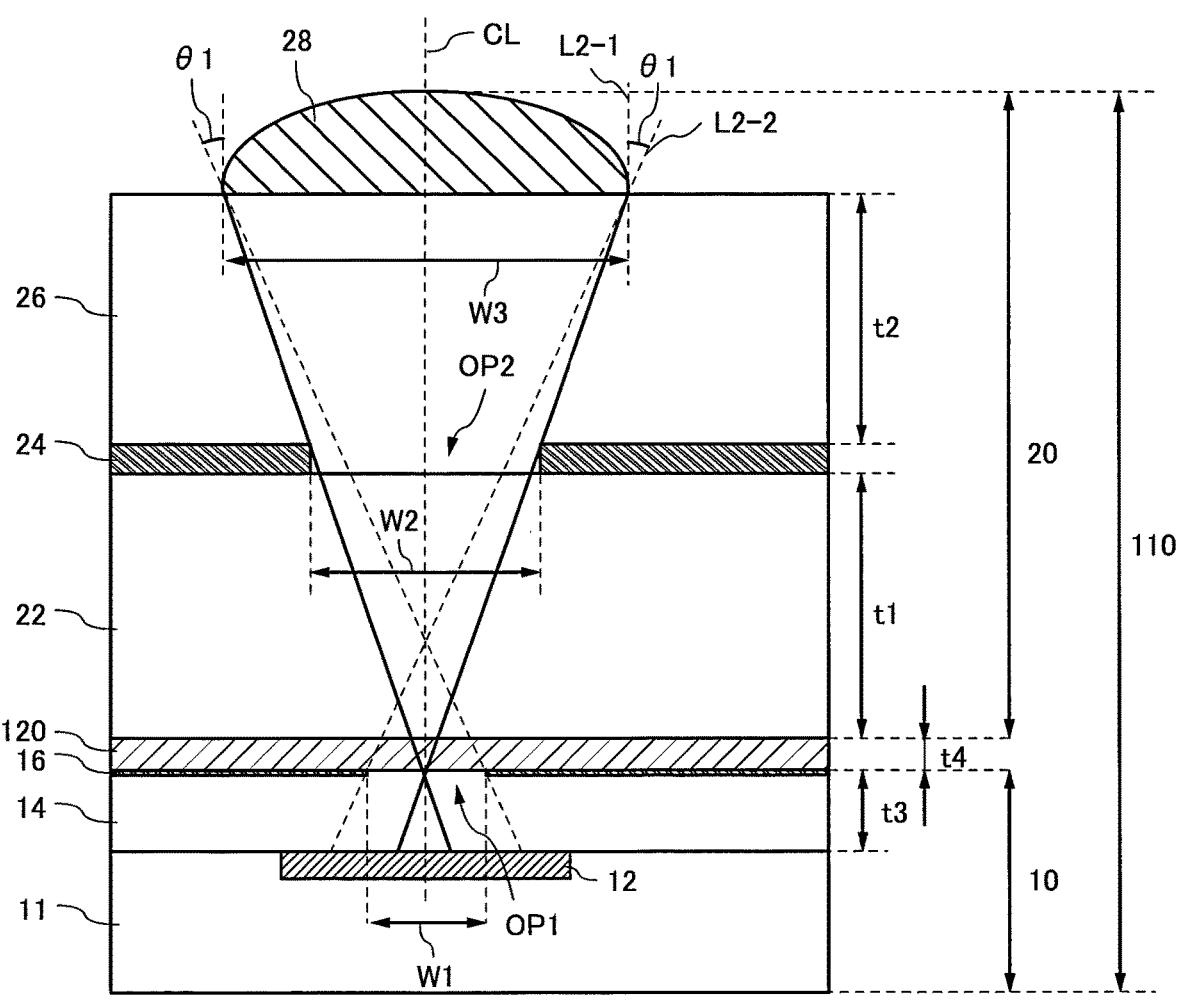
FIG. 2 is a cross-sectional view of a sensor substrate and an enlarged part of a filter layer.
Figure 2:
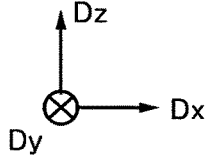

Next, various layers on the sensor substrate 110 will be described in detail. In FIG. 2, the direction from a photodetector 12 to a micro lens 28 is a direction Dz. Let a direction Dx be one direction perpendicular to the direction Dz. Let a direction Dy be a direction perpendicular to the direction Dz and perpendicular to the direction Dx.

The sensor substrate 110 has the array substrate 10, the filter layer 120, and a resin layer 20. The sensor substrate 110 includes a plurality of pixels 30 arranged in a two-dimensional array in the directions Dx and Dy.

FIG. 2 shows a cross-section of one of the plurality of pixels 30 included in the sensor substrate 110. The pixel 30 includes the photodetector 12, a planarization film 14, a light shielding layer 16, the filter layer 120, a translucent resin layer 22, a light shielding layer 24, a translucent resin layer 26, and the micro lens 28 on the substrate 11.

The array substrate 10 includes a substrate 11, the photodetector 12, the planarization film 14, and the light shielding layer 16. The substrate 11 is arranged with a plurality of photodetectors 12. The photodetectors 12 are arranged in a two-dimensional array in the directions Dx and Dy. The planarization film 14 is arranged on the photodetectors 12. The planarization film 14 flattens the surface on which the filter layer 120 is formed. An organic resin is used as the planarization film 14.

The light shielding layer 16 is arranged on the planarization film 14. For example, a metallic material such as molybdenum (Mo) can be used as the light shielding layer 16. For example, the thickness of the light shielding layer 16 is 0.065 μm. In FIG. 2, an opening OP1 is arranged in the light shielding layer 16 in an area overlapping the photodetector 12.

The filter layer 120 is arranged on the light shielding layer 16. The filter layer 120 is directly connected to the light shielding layer 16. In other words, the filter layer 120 is arranged between the light shielding layer 16 and the translucent resin layer 22 in the direction Dz. The filter layer 120 also covers the area overlapping the opening OP1 and contacts the planarization film 14 of the array substrate 10 via the opening OP1. The filter layer 120 is a filter that shields light in a predetermined wavelength band.

The translucent resin layer 22 is arranged directly over and in contact with the filter layer 120. In other words, the translucent resin layer 22 is arranged between the light shielding layer 16 and the light shielding layer 24 in the direction Dz. For example, the translucent resin layer 22 is formed of a translucent acrylic resin.

The light shielding layer 24 is arranged on the translucent resin layer 22. A black organic resin or a light-sheading metallic material is arranged as the light shielding layer 24. For example, the thickness of the light shielding layer 24 is 1.5 μm. The light shielding layer 24 may be made of the same material as the light shielding layer 16 or a different material. The light shielding layer 24 and the light shielding layer 16 may have the same film thickness or different thicknesses. In FIG. 2, an opening OP2 is arranged in the light shielding layer 24 in an area overlapping the photodetector 12 and the opening OP1 in the light shielding layer 16.

The translucent resin layer 26 is directly connected to the light shielding layer 24. The translucent resin layer 26 also covers the area overlapping the opening OP2. For example, the translucent resin layer 26 is formed of acrylic resin.

The micro lens 28 is arranged on the translucent resin layer 26. The micro lens 28 is arranged at a position overlapping the photodetector 12 in the direction Dz. The micro lens 28 is arranged in a two-dimensional array in the directions Dx and Dy. The micro lens 28 collects light incident on the sensor substrate 110 and directs it to the photodetector 12.

A thickness t2 of the translucent resin layer 26 is about the same as or thicker than a thickness t1 of the translucent resin layer 22. The thickness t1 of the translucent resin layer 22 and the thickness t2 of the translucent resin layer 26 are thicker than a thickness t4 of the filter layer 120. The thickness t1 of the translucent resin layer 22 and the thickness t2 of the translucent resin layer 26 are thicker than a thickness t3 of the planarization film 14 of the sensor substrate 110. The thicknesses t1 and t2 are 3 μm or more and 30 μm or less. The thickness t1 is about 18 μm, for example. The thickness t2 is about 16.5 μm, for example. The thickness t3 is 1 μm or more and 10 μm or less, for example, 4.5 μm or more. The thickness t4 of the filter layer 120 is 1 μm or more and 5 μm or less, for example, 1.35 μm.

The relationship between a width W1 of the opening OP1 of the light shielding layer 16, a width W2 of the opening OP2 of the light shielding layer 24, and the width W3 of the micro lens 28 is explained here. The width W1, width W2, and width W3 satisfy the relationship W1<W2<W3.

Light incident on the sensor substrate 110 is focused by the micro lens 28 and transmitted through the translucent resin layer 26. The light transmitted through the translucent resin layer 26 passes through the opening OP2 arranged in the light shielding layer 24. The light transmitted through the translucent resin layer 26 enters the filter layer 120. The filter layer 120 has the function of transmitting light in a predetermined wavelength band.

In an embodiment of the present invention, the filter layer 120 satisfies the following conditions in spectral characteristics.

Condition I: The peak transmittance is 90% or more.
Condition II: The transmittance at a wavelength of 550 nm is 80% or more.
Condition III: The transmittance at a wavelength of 600 nm is 10% or more.
Condition IV: The transmittance at a wavelength of 680 nm to 700 nm is 10% or less.

For example, the filter layer 120 is formed of a green-colored resin material and functions as an IR-cut filter that sheds infrared light. For example, phthalocyanine pigment or acrylic resin can be used as the material of the filter layer 120. In other words, the predetermined wavelength band of the filter layer 120 is 500 nm to 570 nm. The filter layer 120 allows components of the wavelength band required for fingerprint detection to enter the photodetector 12.

When an inorganic film is used as the filter layer 120, the filter layer 120 is formed by vapor deposition. When an inorganic film is vapor-deposited on a large-format substrate, it is difficult to form a uniform thickness of the inorganic film within the substrate surface. Also, if the inorganic film is deposited on terminals and other areas, removing the inorganic film formed on the terminals is difficult. In addition, when the inorganic film is formed by vapor deposition, the throughput and cost increase.

Forming the filter layer 120 with a green-colored resin material can be manufactured in the same way as the manufacturing process for the color filter layer of conventional LCD panels. Therefore, the detection device 100 according to an embodiment of the present invention, has excellent mass-productivity.

The detection device 100 according to an embodiment of the present invention can improve the detection accuracy of fingerprints under natural light. The results of verifying the detection accuracy of fingerprints using the detection device 100 pertaining to an embodiment of the present invention are described below.

First, six types of filter layers with different spectral characteristics were prepared. Filter layers 120A to 120D are all green-colored resin materials. Filter layers 120E and 120F are filter layers formed of inorganic material. For example, the filter layers 120E and 120F are formed of silicon oxide and silicon nitride films. The filter layers 120E and 120F are formed of different materials.

Figure 3:
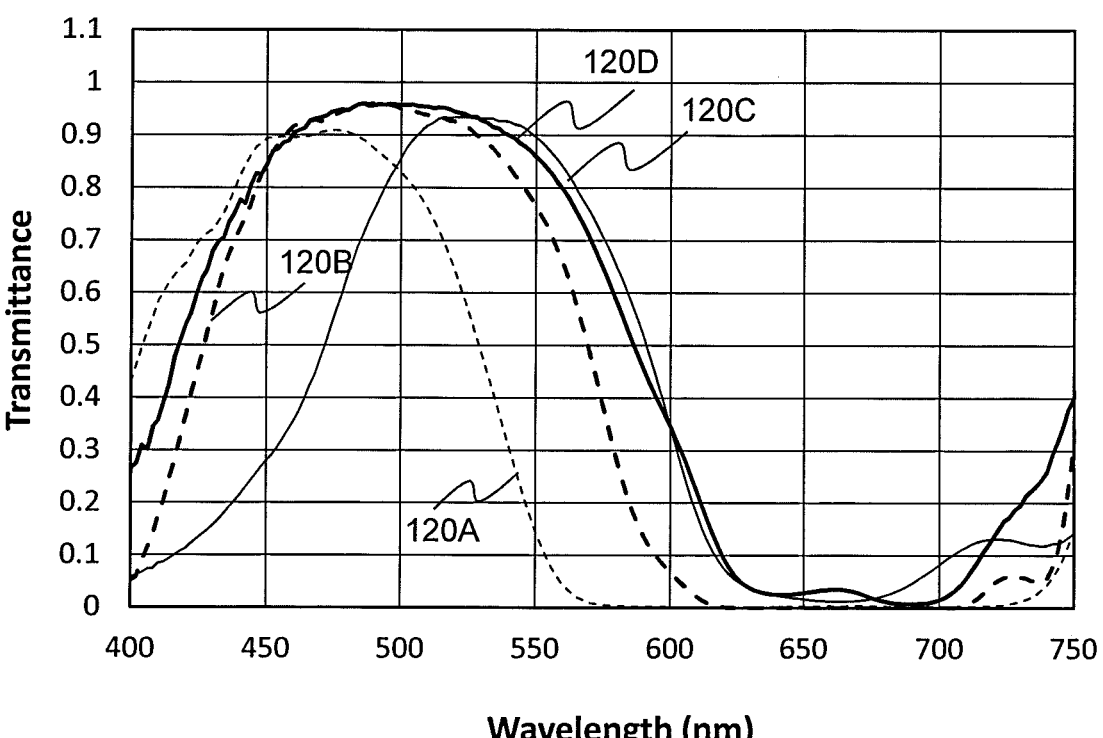
FIG. 3 is a graph comparing spectral characteristics of filter layers using organic resins used in a detection device.

FIG. 3 compares the spectral characteristics of the filter layers 120A to 120D in the detection device. In FIG. 3, the thin dotted line shows the spectral characteristics of the filter layer 120A, and the thick dotted line shows the spectral characteristics of the filter layer 120B. The thin solid line shows the spectral characteristics of the filter layer 120C, and the thick solid line shows the spectral characteristics of the filter layer 120D.

Figure 4:
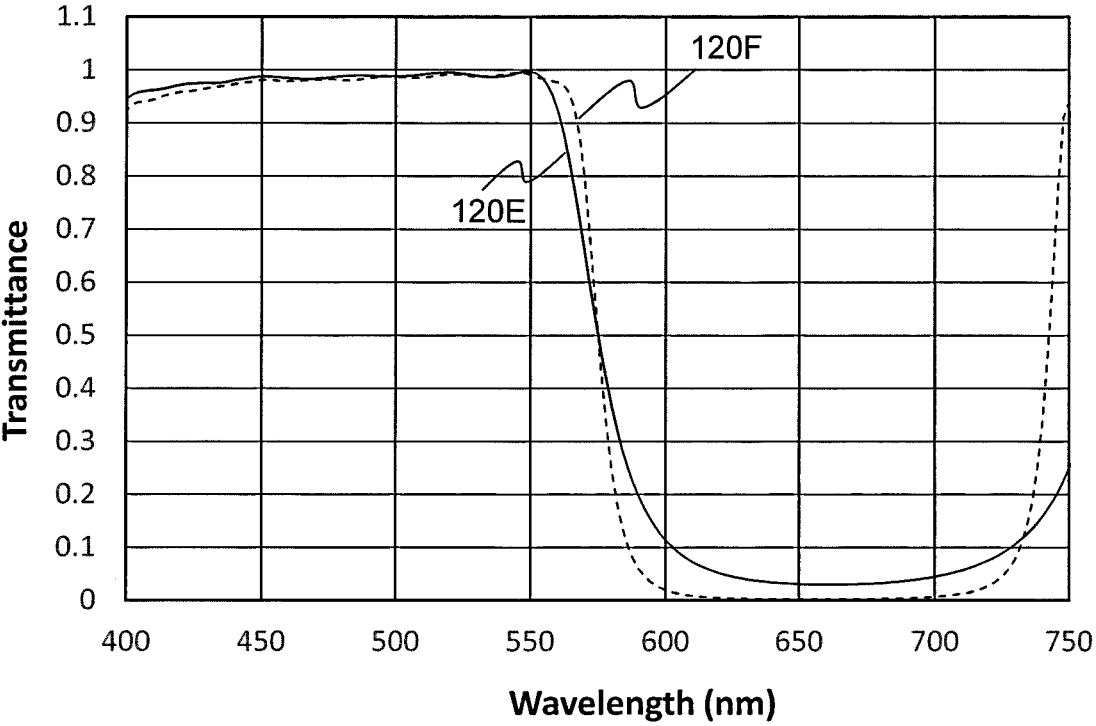
FIG. 4 is a graph comparing spectral characteristics of filter layers using inorganic films used in a detection device.

FIG. 4 compares the spectral characteristics of filter layers 120E and 120F in the detection device.

The spectral characteristics of filter layers 120A to 120F are shown in FIG. 3 and FIG. 4, and it was evaluated whether each of the filter layers 120A to 120F satisfied the following conditions.

Condition I: Peak transmittance is 90% or more.
Condition II: Transmittance at a wavelength of 550 nm is 80% or more.
Condition III: Transmittance at a wavelength of 600 nm is 10% or more.
Condition IV: Transmittance at a wavelength 680 nm to 700 nm is 10% or less.

Table 1 shows the condition matching in the filter layers 120A to 120F.

TABLE 1

| Filter Layer | Material | Condition I | Condition II | Condition III | Condition IV |
|---|---|---|---|---|---|
| 120A | Organic | ○ | x | x | ○ |
| 120B | Organic | ○ | Δ | Δ | ○ |
| 120C | Organic | ○ | ○ | ○ | ○ |
| 120D | Inorganic | ○ | ○ | ○ | ○ |
| 120E | Inorganic | ○ | ○ | ○ | ○ |
| 120F | Inorganic | ○ | ○ | x | ○ |

In Table 1, a symbol of circle indicates that the condition is satisfied, a symbol of cross indicates that the condition is not satisfied, and a symbol of triangle indicates that the condition is somewhat not satisfied.

From FIG. 3, FIG. 4, and Table 1, it was found that filter layers 120C to 120E are the filter layers that satisfy all conditions I to IV. It was found that the filter layer 120B somewhat failed to satisfy conditions II and III.

Next, a detection device 200A, in which a filter layer 120A was formed on the array substrate with a photodetector, a detection device 200B, in which a filter layer 120B was formed on the array substrate, a detection device 200C, in which a filter layer 120C was formed on the array substrate, a detection device 200D, in which filter layer 120D on the array substrate, a detection device 200E in which a filter layer 120E on the array substrate, and a detection device 200F in which a filter layer 120F on the array substrate are described. The configuration of detection devices 200A to 200F corresponds to the configuration in the detection device 100 shown in FIG. 1, in which the filter layer 120 replaces the filter layers 120A to 120F.

Next, it was evaluated whether or not fingerprints could be detected for these detection devices under 100,000 lux pseudo-sunlight.

Table 1 shows the results of the evaluation of whether or not fingerprints could be detected for the detection devices 200A to 200F.

TABLE 2

| Detection Device | Result |
| --- | --- |
| 200A | x |
| 200B | x |
| 200C | ○ |
| 200D | ○ |
| 200E | ○ |
| 200F | x |

In Table 2, symbols of circles indicates that fingerprints could be detected under pseudo-sunlight, and symbols of crosses indicates that fingerprints could not be detected under pseudo-sunlight.

As shown in Tables 1 and 2, it was found that the detection devices 200C to 200E using the filter layers 120C to 120E satisfying all of the conditions I to IV could detect fingerprints even under pseudo-sunlight. In contrast, the detection devices 200A, 200B, and 200F using the filter layers 120A, 120B, and 120F, which contain any one of the conditions I to IV that do not satisfy the conditions, were found to be unable to detect fingerprints under pseudo-sunlight.

The above results showed that fingerprints could be detected even under pseudo-sunlight using green organic resin (so-called color filter) in a detection device.

Next, it will explain how to calculate the required characteristics as quantitative values when using the color filter as an IR cut filter.

Based on the transmittance of the filter layer 120 and the quantum efficiency of the image sensor in which the filter layer 120 is installed, the signal-to-noise ratio of the image sensor in which the filter layer 120 is installed can be calculated. The signal-to-noise ratio of the image sensor with the filter layer 120 can be calculated based on the quantum efficiency of the image sensor with the filter layer 120. The signal-to-noise ratio of the image sensor with the filter layer 120 is expressed by the following equation (1): S/N ratio is the ratio of the effective signal component (signal) to the noise component (noise).

$$S/N \text{ ratio} = \frac{\int_{530}^{680} (A(x) * QE(x) + N)dx}{\int_{680}^{780} (A(x) * QE(x) + N)dx} \quad (1)$$

Here, A(x) represents the transmittance (spectral transmittance) of the filter layer; QE(x) represents the quantum efficiency of the image sensor; N represents the steady-state noise component at the time of measurement; and QE(x) represents the quantum efficiency of the image sensor.

The S/N ratio calculated by the above Equation (1) and the S/N ratio calculated similarly when an external IR filter is used should satisfy the following Equation (2). The external IR cut filter is a material that can detect fingerprints under natural light when used in a detection device.

$$\frac{\int_{530}^{680} (A(x) * QE(x) + N)dx}{\int_{680}^{780} (A(x) * QE(x) + N)dx} > \frac{\int_{530}^{680} (IR(x) * QE(x) + N)dx}{\int_{680}^{780} (IR(x) * QE(x) + N)dx} \quad (2)$$

Here, IR(x) represents the spectral transmission of the external IR filter.

In the above Equation (2), the S/N ratio is calculated from the spectral transmittance IR(x) of the external IR cut filter to be targeted, the quantum efficiency QE(x) of the image sensor, and the steady-state noise component N during measurement. The S/N ratio is calculated from the spectral transmittance A(x) of the filter layer 120 used as the IR cut filter, the quantum efficiency QE(x) of the image sensor, and the steady-state noise component N during measurement. If the relationship in Equation (2) is satisfied, it can be evaluated that the required characteristics have been obtained when the filter layer 120 is used in a detection device.

The following describes the results of evaluating the signal-to-noise ratio for the filter layers 120B and 120C.

Figure 5:
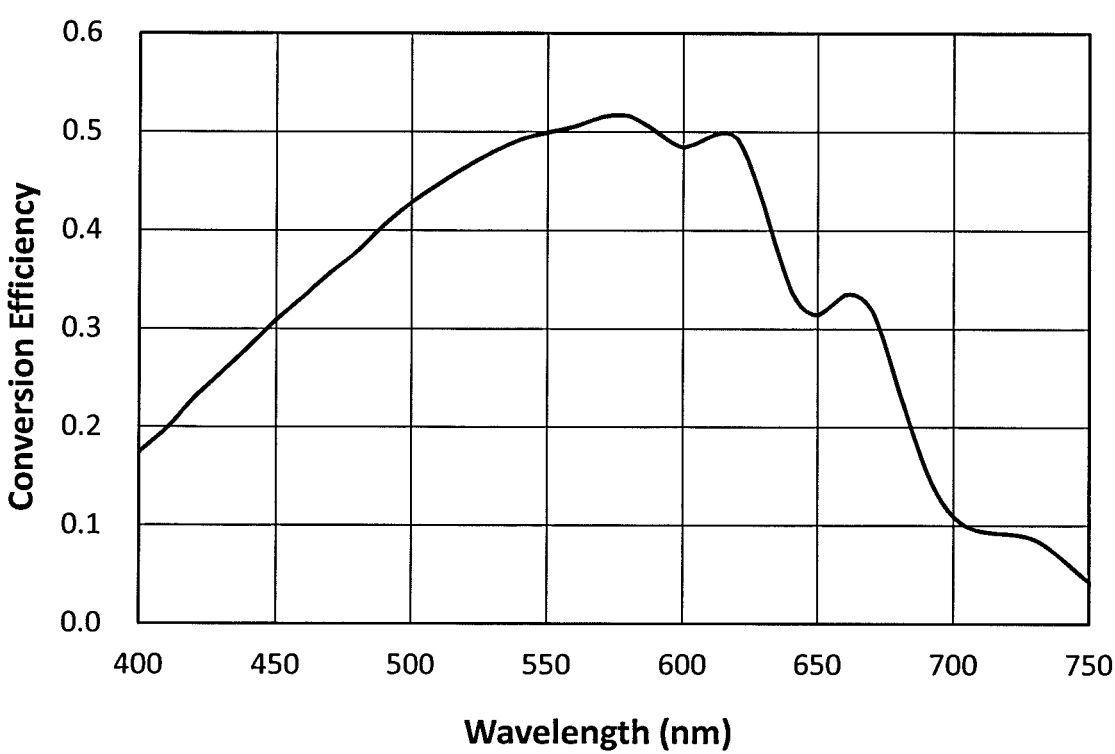
FIG. 5 is an example of quantum efficiency of an image sensor.

FIG. 5 shows an example of the quantum efficiency QE of an image sensor. In FIG. 5, the horizontal axis is wavelength [nm], and the vertical axis is conversion efficiency.

Figure 6:
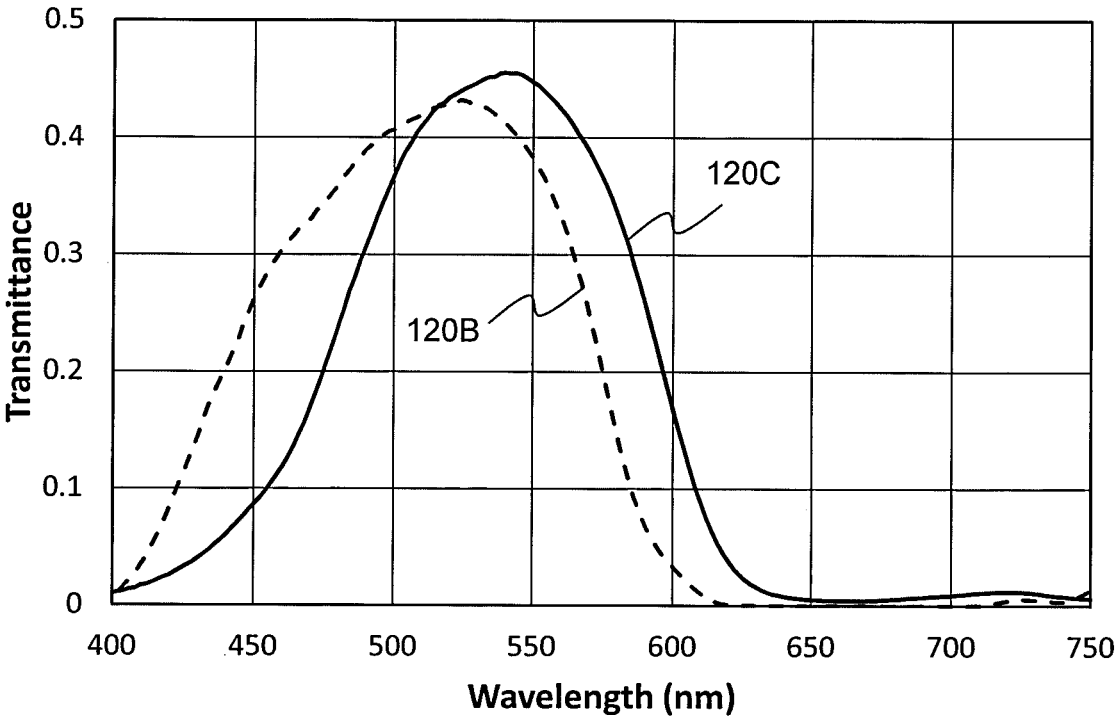
FIG. 6 is a graph comparing the product of spectral characteristics and quantum efficiency of filter layers using organic resins used in a detection device.

FIG. 6 is the product of the spectral transmittance A(x) and the quantum efficiency (QE) of the filter layer 120B and the spectral transmittance A(x) and the quantum efficiency (QE) of the filter layer 120C, as described above. According to FIG. 6, when comparing the filter layer 120B and the filter layer 120C, the filter layer 120B has a broader wavelength band that transmits light.

Figure 7:
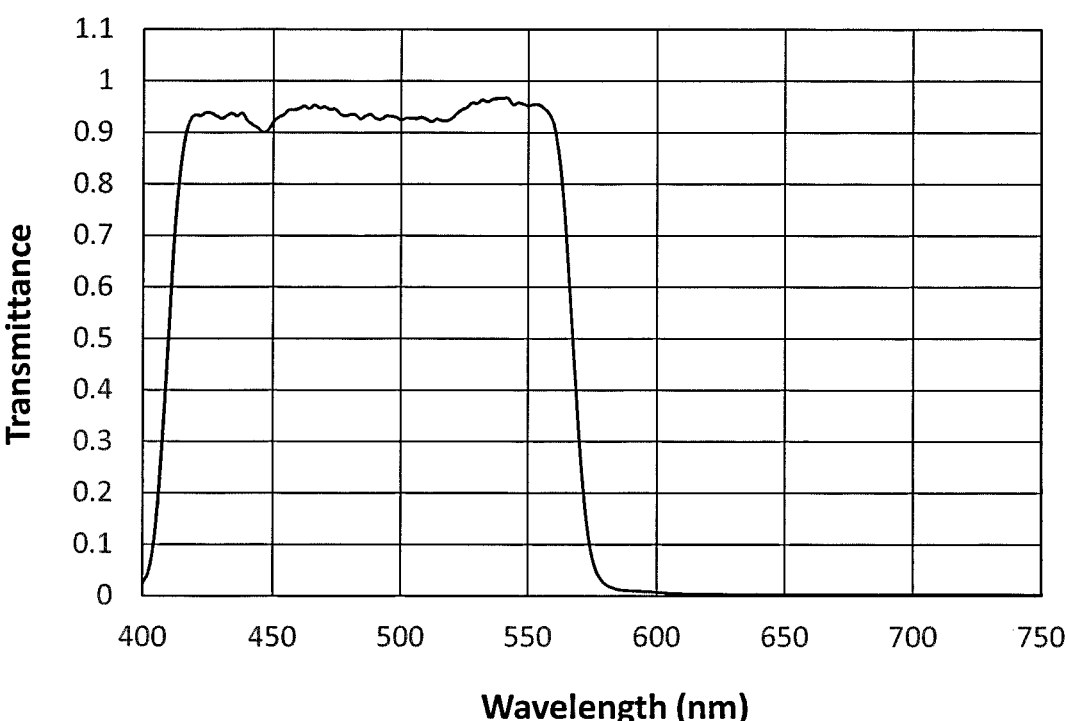
FIG. 7 is a graph showing spectral characteristics of an external IR cut filter used in a detection device.

FIG. 7 shows the spectral characteristics of the target external IR cut filter. In FIG. 7, the horizontal axis is wavelength [nm], and the vertical axis is the external IR cut filter's spectral transmittance IR(x).

When the noise component is 0.0297 in Equation (2), the S/N ratio of the IR cut filter can be obtained as 7.60 from the quantum efficiency QE shown in FIG. 5 and the spectral transmission IR(x) of the external IR cut filter shown in FIG. 7.

In Equation (2), when the noise component is 0.0297, the S/N ratio of the filter layer 120B is determined to be 6.43 from the quantum efficiency QE shown in FIG. 5, and the spectral transmission A(x) of the filter layer 120B shown in FIG. 6.

In Equation (2), when the noise component is 0.0297, the S/N ratio of the filter layer 120C is obtained to be 8.13 from the quantum efficiency QE shown in FIG. 5 and the spectral transmission A(x) of the filter layer 120C shown in FIG. 6.

In Equation (2), when the noise component is 0.0297, the S/N ratio of the filter layer 120B is determined to be 6.43 from the quantum efficiency QE shown in FIG. 5 and the spectral transmittance A(x) of the filter layer 120B shown in FIG. 6. When the noise component is 0.0297 in Equation (2), the S/N ratio of 120C can be obtained as 8.13 from the quantum efficiency QE shown in FIG. 5 and the spectral transmittance A(x) of 120C shown in FIG. 6. Comparing the S/N ratio of the external IR cut filter with that of the filter layer 120B, the S/N ratio of the filter layer 120B is smaller. As shown in Table 2, fingerprints could not be detected in the detection device 200B using the filter layer 120B. Comparing the S/N ratio of the external IR cut filter and the S/N ratio of the filter layer 120C, it can be seen that the S/N ratio of the filter layer 120C is larger. As shown in Table 2, fingerprints could be detected in the detection device 200C using the filter layer 120C. Thus, comparing the S/N ratio of the external IR cut filter and the S/N ratios of filter layers 120B and 120C proved consistent with the accuracy of fingerprint detection in the detection device. As explained above, it has been proved that, in evaluating the external IR cut filter and the 120 filter layers, the characteristics required for the 120 filter layers used in the fingerprint detection device can be evaluated using Equation (2).

(Modification 1)

Figure 8:
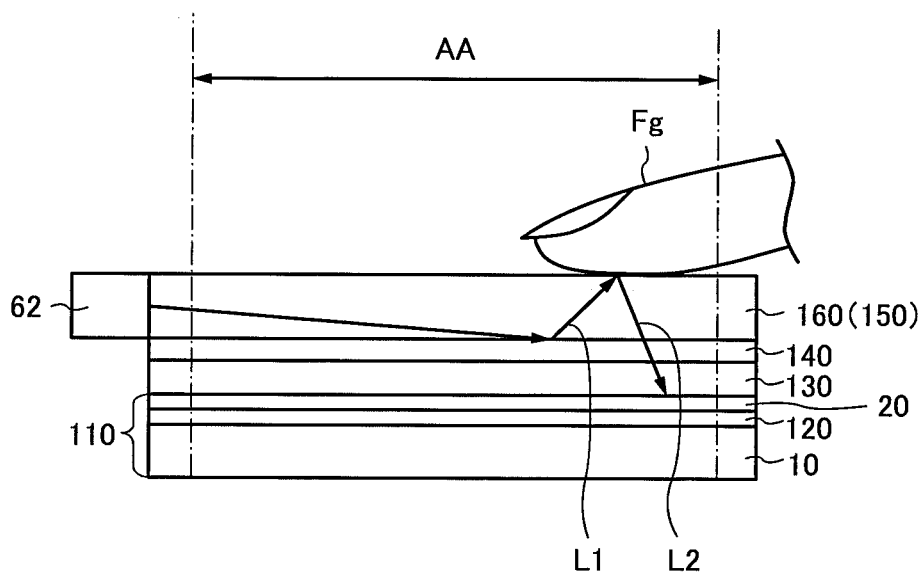
FIG. 8 is a cross-sectional view of a detection device according to an embodiment of the present application.

Although the detection device 100 according to an embodiment of the present invention is described in terms of a configuration having a display panel 130 on the sensor substrate 110, the detection device 10 is not limited to this configuration. For example, it may have a lighting device on the sensor substrate 110 instead of the display panel 130. FIG. 8 shows a detection device 100A with a configuration that differs in part from the detection device 100 shown in FIG. 1. As the lighting device 160 shown in FIG. 8, for example, the cover member 150 may be used as a light guide plate arranged at a position corresponding to the detection area AA of the detection device 100A. It may also be a so-called sidelight type front light having a plurality of light sources 62 lined up at one or both ends of the cover member 150. In other words, the cover member 150 has a light-illuminated surface that illuminates light and is one component of the lighting device 160. According to the lighting device 160, the light L1 is irradiated from the light-illuminated surface of the cover member 150 toward the finger Fg, which is the detection target. For example, a light-emitting diode (LED: Light Emitting Diode) emits light of a predetermined color and is used as a light source 62.

(Modification 2)

Figure 9:
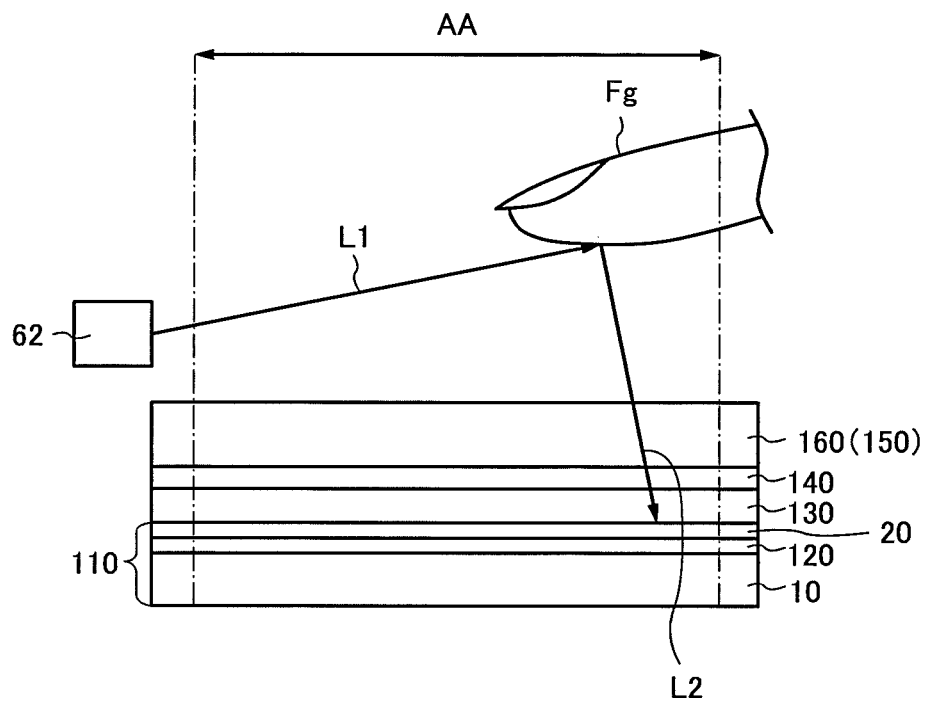
FIG. 9 is a cross-sectional view of a detection device according to an embodiment of the present application.

Although the detection device 100A according to an embodiment of the present invention, is described in a configuration in which a side-lit front-lit lighting device 160 is used, the detection device 100A is not limited to this configuration. The light source 62 of the lighting device 160 may be arranged on the side or above the cover member 150. FIG. 9 shows a detection device 100B with a configuration that partially differs from the detection device 100A shown in FIG. 8. In the lighting device 160A shown in FIG. 9, the light source 62 is arranged above the cover member 150. The light L1 may be irradiated to the finger Fg from the side or above the finger Fg.

(Modification 3)

Figure 10:
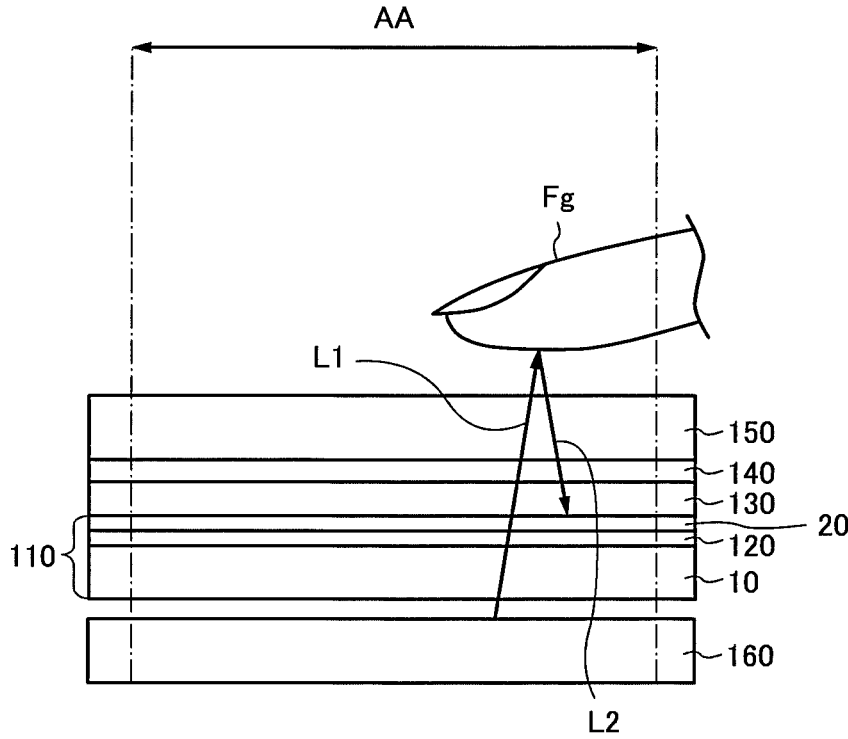
FIG. 10 is a cross-sectional view of a detection device according to an embodiment of the present application.

Although the detection device 100B according to an embodiment of the present invention, is described in a configuration in which the light source 62 of the lighting device 160 is arranged above the cover member 150, the detection device 100B is not limited to this configuration. The lighting device 160 may be a direct backlight with the light source 62 arranged in the detection area AA of the detection device 100. FIG. 10 shows a detection device 100C with a configuration that differs in part from the detection device 1006 shown in FIG. 9. The light L1 irradiated from the lighting device 160 is reflected as light L2 by the finger Fg, the detection target. The detection device 100C detects the light L2 reflected by the finger Fg.

As explained above, the detection devices 100, 100A to 100C, according to an embodiment of the invention, can be applied in various forms. Therefore, based on the detection devices 100, 100A-100C described as embodiments of the invention, those to which a person skilled in the art has made additions, deletions, or design changes of components, or additions, omissions, or condition changes of processes as appropriate, are also included in the scope of the invention as long as they have the gist of the invention. In addition, each of the embodiments described above can be combined so long as no technical contradiction arises.

It is also understood that other effects different from those brought about by the embodiments described above, which are obvious from the description herein or can be easily predicted by a person skilled in the art, are naturally brought about by the present invention.

Within the scope of the present invention, those skilled in the art can make various changes and modifications, and it is understood that these changes and modifications also fall within the scope of the present invention. For example, additions, deletions, or design changes of components, additions, omissions, or changes of conditions of processes to the embodiments mentioned above are also included in the scope of the invention as long as they have the gist of the invention.

What is claimed is:

1. A detection device comprising:
   a photodetector;
   a filter layer overlapping the photodetector and including a first color material having a peak transmittance for light in a first wavelength band; and
   a display panel arranged over the filter layer,
   a micro lens on a light receiving side on the photodetector;
   a first light shielding layer arranged between the photodetector and the filter layer, being in direct contact with the filter layer, and including a first opening overlapping the photodetector; and
   a second light shielding layer arranged between the photodetector and the micro lens, and including a second opening overlapping the photodetector and the first opening,
   wherein the filter layer has a peak transmittance of 90% or more,
   a transmittance of 80% or more at a wavelength of 550 nm,
   a transmittance of 10% or more at a wavelength of 600 nm, and
   a transmittance of 10% or less at a wavelength of 680 nm to 700 nm
   the first light shielding layer and the second light shielding layer are formed of a metal material, and
   the filter layer is arranged between the photodetector and the micro lens.

2. The detection device according to claim 1, wherein the first wavelength band is 500 nm to 570 nm.

3. The detection device according to claim 1, wherein a thickness of the first light shielding layer is smaller than a thickness of the second light shielding layer.

4. The detection device according to claim 1, wherein a thickness of the first light shielding layer is 0.065 μm, and a thickness of the second light shielding layer is 1.5 μm.

5. The detection device according to claim 1, wherein a width of the first opening is defined as W1, a width of the second opening is defined as W2, and a width of the micro lens is defined as W3, W1 is smaller than both W2 and W3, and W2 is smaller than W3 in a cross-sectional view.

6. The detection device according to claim 1, further comprising:
   a first translucent resin layer arranged between the filter layer and the second light shielding layer, and
   a second translucent resin layer arranged between the second light shielding layer and the micro lens.

7. The detection device according to claim 6, wherein a thickness of the second translucent resin layer is greater than or equal to a thickness of the first translucent resin layer.

\* \* \* \* \*